United States Patent
Moriyama et al.

(10) Patent No.: US 8,356,393 B2
(45) Date of Patent: Jan. 22, 2013

(54) METHOD FOR MANUFACTURING A POLYMERIC PIEZOELECTRIC FILM

(75) Inventors: Nobuhiro Moriyama, Tokyo (JP); Ken'ichi Nakamura, Fukushima-Ken (JP); Kazuyuki Suzuki, Fukushima-Ken (JP); Keitarou Suzuki, Fukushima-Ken (JP)

(73) Assignee: Kureha Corporation, Tokyo (JP)

( * ) Notice: Subject to any disclaimer, the term of this patent is extended or adjusted under 35 U.S.C. 154(b) by 656 days.

(21) Appl. No.: 12/448,856

(22) PCT Filed: Jan. 8, 2008

(86) PCT No.: PCT/JP2008/050084
§ 371 (c)(1),
(2), (4) Date: Jul. 10, 2009

(87) PCT Pub. No.: WO2008/084787
PCT Pub. Date: Jul. 17, 2008

(65) Prior Publication Data
US 2010/0068460 A1    Mar. 18, 2010

(30) Foreign Application Priority Data
Jan. 10, 2007   (JP) ................. 2007-002366

(51) Int. Cl.
*H04R 17/10* (2006.01)
*H01L 41/107* (2006.01)
(52) U.S. Cl. .......... 29/25.35; 29/850; 361/233; 264/435
(58) Field of Classification Search ................ 29/25.35, 29/842, 831, 850; 361/233; 264/435, 436, 264/438; 15/256.51; 174/138 C
See application file for complete search history.

(56) References Cited

U.S. PATENT DOCUMENTS

| 3,878,274 A | * | 4/1975 | Murayama et al. | ....... 264/436 X |
| 4,067,056 A | * | 1/1978 | Taylor et al. | .................. 361/233 |
| 4,079,437 A | * | 3/1978 | Sheffield | ................ 292/25.35 X |
| 4,340,786 A | * | 7/1982 | Tester | ........................ 264/435 X |
| 5,559,591 A | * | 9/1996 | Kato et al. | ............. 15/256.51 X |
| 5,677,052 A | * | 10/1997 | Shimoda et al. | ....... 174/138 C X |

FOREIGN PATENT DOCUMENTS

| JP | 51-12699 | 1/1976 |
| JP | 52-133384 | 11/1977 |

(Continued)

OTHER PUBLICATIONS

International Search Report dated Feb. 5, 2008 in the International (PCT) Application PCT/JP2008/050084 of which the present application is the U.S. National Stage.

*Primary Examiner* — A. Dexter Tugbang
(74) *Attorney, Agent, or Firm* — Wenderoth, Lind & Ponack, L.L.P.

(57) ABSTRACT

A method for producing a polymer piezoelectric film, comprising: a process of moving and stretching a crystalline polar polymer sheet in contact with a conductive stretching roller having a diameter of at least 30 mm and a surface friction coefficient which has been reduced to such a level as to allow a relative displacement of the crystalline polar polymer sheet in contact with the conductive stretching roller: and a step in the process of applying a polarization voltage between an electrode disposed opposite to the crystalline polar polymer sheet and the conductive stretching roller to polarize the crystalline polar polymer sheet. As a result, it is possible to stably produce a polymer piezoelectric film exhibiting stable piezoelectricity over a large area. Especially, it is possible to obtain polymer piezoelectric film exhibiting a temperature-dispersion peak temperature of $d_{31}$ piezoelectricity coefficient at least 120° C. and surface scratches extending in one direction.

9 Claims, 3 Drawing Sheets

FOREIGN PATENT DOCUMENTS

| | | |
|---|---|---|
| JP | 56-126912 | 10/1981 |
| JP | 60217674 A * | 10/1985 |
| JP | 1-91412 | 4/1989 |
| JP | 5-125522 | 5/1993 |
| JP | 8-36917 | 2/1996 |
| JP | 2003-31865 | 1/2003 |
| JP | 2003-80593 | 3/2003 |

* cited by examiner

US 8,356,393 B2

METHOD FOR MANUFACTURING A POLYMERIC PIEZOELECTRIC FILM

TECHNICAL FIELD

The present invention relates to a method for stably producing a polymer piezoelectric film having a stably large piezoelectricity (and pyroelectricity), and a polymer piezoelectric film thus formed.

BACKGROUND ART

As a typical method for producing a high-performance piezoelectric film as represented by a large piezoelectricity (usually developing also pyroelectricity as is well known), there is known a type of method, comprising: polarizing a crystalline polymer sheet of, e.g., a polyvinylidene fluoride resin by corona discharge from a pair of electrodes, at least one of which comprises a needle electrode, disposed opposite to each other so as to place the crystalline polymer sheet therebetween, while stretching the crystalline polymer sheet (Patent documents 1 and 2). Incidentally, the terms "sheet" and "film" are used herein so that the former refers to a state before stretching and the latter refers to a state after stretching, regardless of a conventional use thereof in the art that they are differentiated from each other with reference to 250 μm as a boundary thickness. In the above-mentioned methods of Patent documents 1 and 2, needle electrodes are principally used as both of the par of electrodes disposed opposite to each other between which the crystalline polymer sheet is placed, whereas there is also shown a n example wherein a roller electrode is used as one of them (Example 2 of Patent document 2). However, the polymer piezoelectric films thus obtained through the above-mentioned methods still involve irregularities in thickness and piezoelectric performance in a planar direction, and the production conditions thereof have not been satisfactorily stabilized, so that as a present state, it is impossible to obtain a polymer piezoelectric film having a stably large piezoelectricity over a wide area.

Patent document 1: JP-A 55-157801
Patent document 2: EP-A 018802

DISCLOSURE OF INVENTION

In view of the above-mentioned situation, a principal object of the present invention is to provide a method for stably producing a polymer piezoelectric film having a stably large piezoelectricity over a large area, and a polymer piezoelectric film thus formed and exhibiting stable piezoelectric performances.

The method for producing a polymer piezoelectric film of the present invention has been developed in order to accomplish the above-mentioned object, and more specifically, includes: a process of moving and stretching a crystalline polar polymer sheet in contact with a conductive stretching roller having a diameter of at least 30 mm and a surface friction coefficient which has been reduced to such a level as to allow a relative displacement of the crystalline polar polymer sheet in contact with the conductive stretching roller, and a step in the process of applying a polarization voltage between an electrode disposed opposite to the crystalline polar polymer sheet and the conductive stretching roller to polarize the crystalline polar polymer sheet.

A history through which the present inventors have studied with the above-mentioned object to arrive at the present invention, will be briefly described.

As a result of earnest study about the methods for producing a high-performance polymer piezoelectric film, the present inventors have arrived at a conclusion that the reason why the above-mentioned production methods of Patent documents 1 and 2 have failed in stable production of a polymer piezoelectric film having a stably large piezoelectricity over a large area is attributable to a failure in control of the conditions for neck stretching which is necessary for development of stable piezoelectric performances of a crystalline polymer film. More specifically, in the process of stretching a crystalline polymer sheet at a temperature below the melting point thereof while moving the crystalline polymer sheet, the stretching is caused not in a form that the thickness and width thereof are gradually decreased in the moving direction but usually in a form (of neck stretching) that the thickness and width are abruptly decreased to form a constriction (a neck or a necking portion) at a point in the moving direction. In the case where a polyvinylidene fluoride resin (hereinafter sometimes representatively abbreviated as "PVDF") is used as a crystalline and also polar polymer, the neck stretching causes a transformation from a substantially non-polar α-from crystal to a polar β-form crystal and if a DC-high voltage is effectively applied to the neck in this instance, a high degree of piezoelectricity is developed. However, in the production methods of Patent documents 1 and 2, it has been difficult to stably control the neck stretching. If a first consideration is made on the case of polarization using non-contact electrodes, such as a pair of needle electrode rows principally disclosed in Patent documents 1 and 2, the heating condition for a crystalline polymer sheet moved at a prescribed speed (while the case of batch treatment is set aside) cannot be made uniform because of thickness irregularity or other causes present in the sheet, thus making it difficult to form a necking portion, so that it becomes difficult to form a polymer piezoelectric film having a stable piezoelectricity over a large area. Further, the sheet or film during the stretching is liable to be sucked to touch one side of needle electrodes, thus causing breakage thereof.

On the other hand, Patent document 2 discloses, as shown in FIG. 1 attached hereto (corresponding to FIG. 6 of Patent document 2), an example (Example 2) wherein a PVDF sheet 11 was stretched while being moved along a heating roller (also acting as a counter electrode) 12 and was polarized by applying a DC voltage of 8 kV between the heating roller 12 and needle electrodes 13 connected to a DC high-voltage power supply 14 and 8 mm spaced apart from the sheet 11 to obtain a polarized PVDF piezoelectric film 11'. According to this embodiment, a more stable neck stretching has become possible because one counter electrode was a heating roller compared with the case of using a pair of needle electrodes to rely on the environmental temperature as a heating source. Also in this case, however, it was still difficult to form a polymer piezoelectric film having a sufficiently stable piezoelectricity in the width direction or length direction of the film 11'. According to the present inventors' study, this is also attributable to a failure in stable control of neck stretching. This point is explained with reference to FIG. 2 which is a schematic view showing a state of the PVDF sheet 11 moving over the roller 12 as viewed in the direction of an arrow A in FIG. 1.

With reference to FIG. 2 and FIG. 1, a PVDF sheet 11 sent at a speed R from an upstream side of a roller 12 having a diameter D1 causes necking (to form a neck N) on the roller 12 to cause a crystal transformation from α-form to β-form while reducing its width and thickness, and is taken up at a speed R' larger than R to be wound about a take-up roller (not shown) disposed on the downstream side. (R and R' are vectors representing moving direction and speed of the PVDF sheet 11 or PVDF film 11'.) In this operation, the PVDF sheet 11 contacts the roller 12 over a length (arc) L1 of the roller 12 and, during the contact period, is polarized to be provided with a high piezoelectricity due to a DC (direct current) voltage applied between the needle electrodes 13 and the roller 12 which also functions as a counter electrode. In this instance, it is ideal for the neck line (constriction line) at which the width and thickness of the sheet 11 is abruptly reduced to be formed as an apparently stationary linear line as denoted by NL in FIG. 2, which is parallel to the roller axis O and keeps its relative position in the sheet moving direction R (and R') with respect to the roller axis O, within the lengthwise range L1 of contact with the roller 12.

However, as a result of the present inventors' earnest study for reducing the fluctuation in piezoelectricity of the polymer piezoelectric film obtained by the method of Patent document 2 and detailed observation of neck stretching state of the sheet 11 on the roller 12, it has been discovered that the neck line NL, which should ideally form a stationary linear line, causes (i) a movement to an upstream side or a downstream side as represented by arrows V and V' in FIG. 2 and (ii) a deformation from a linear line NL to change the positions of neck stretching along the width of the sheet 11, most typically, to form a bellow-like neck line NL' by a largest deviation to a downstream side at a position around the center of the sheet width. Such instability of neck stretching is considered to be partly attributable to a high electric field simultaneously applied with the neck stretching for polarization, which restricts the molecular movement of PVDF constituting the sheet and exerts a force obstructing the neck stretching. Further, it has become clear that the non-ideal neck stretching state has obstructed the stable development of a high-degree of piezoelectricity. This is because if the neck line NL goes outside the range of contact length L1 due to such a non-ideal neck stretching state, the polarization due to application of a DC voltage between the electrodes 13 and 12 is not effectively accomplished.

Then, the present inventors tried to use a larger diameter roller having a diameter $D_2$ (at a glance, similar to a roller 22 shown in FIG. 3 and used in examples of the present invention) instead of the smaller diameter roller 12 having a diameter $D_1$ usually used as a stretching roller, so as to provide an increased length L2 (>L1) of contact between the sheet 11 and the roller 12, thereby retaining the neck line NL or NL' within the limits of length L2 of contact with the roller, even when the above-mentioned non-ideal neck stretching phenomena (i) and (ii) occurred. In this case, however, the breakage of PVDF sheet having a small thickness on the order of 100-500 μm occurred frequently, so that a commercial production was found to be impossible (Comparative Example 2 appearing hereinafter). This is presumably, because, in the case of a neck stretching giving a velocity ratio R'/R exceeding 2 between the downstream and upstream of the neck line, it was difficult obtain a roller peripheral speed harmonized with both R and R'. This is in line with the conventional practice in the art that small diameter rollers are generally used in stretching processes (not only in the case of neck stretching) where plastic sheet are moved at different speeds between the upstream and downstream of the rollers. The above-mentioned breakage of PVDF sheet is understood to be promoted by other factors, such that the application of a high electric field applied in the direction of the sheet thickness simultaneously with the neck stretching exerts a pressure in the direction of the electric field due to the piezoelectricity of the sheet itself, and the electric field exerts a force obstructing the molecular movement of PVDF to obstruct the flexible deformability of the sheet.

On the other hand, the present inventors have acquired the following knowledge. Even a roller having a large diameter $D_2$ can be used as a stretching roller contacting the neck stretching portion of a thin polymer piezoelectric stock sheet while obviating the breakage of the sheet if its surface friction coefficient has been reduced to such a level as to allow a relative displacement of the polymer piezoelectric stock sheet in contact with the roller instead of mirror surface-finished rollers generally used in plastic sheet transportation and used as small-diameter roller (D1) or large-diameter roller (D2) in the above examples. Further, by using such an improved large-diameter roller, among the above-mentioned non-ideal neck stretching phenomena, (i) the movement of neck line position still remains but can be sufficiently stably retained within the range of contact length L2 with the roller, and (ii) the formation of a non-linear neck line NL' can be remarkably suppressed to stably obtain a substantially linear neck line NL, whereby commercial production of a polymer piezoelectric film stably exhibiting a high-degree of piezoelectricity has become possible.

The above-mentioned method for producing a polymer piezoelectric film of the present invention has been developed as a result of a series of knowledge described above.

Further, a characteristic of the polymer piezoelectric film obtained by the polarization (stretching-polarization concurrent processing) by the DC (direct-current) high-voltage application at the neck stretching portion adopted by the method for producing the polymer piezoelectric film of the present invention, is that it has a remarkably improved thermal resistance of piezoelectricity (represented by, e.g., a piezoelectricity coefficient in the stretching direction (i.e., $d_{31}$ piezoelectricity coefficient)), compared with a polymer piezoelectric film obtained through conventional stretching→polarization sequential processing. For example, compared with a temperature-dispersion peak temperature of $d_{31}$ piezoelectricity coefficient of ca. 100° C. obtained through conventional stretching→polarization sequential processing, a value of at least 120° C. can be obtained. This means that the polymer piezoelectric film can withstand heating up to 120° C. and can retain its piezoelectricity even thereafter. Particularly, in the case of using a surface-roughened conductive stretching roller according to a preferred embodiment of the production method according to the present invention, the resultant piezoelectric film is provided with surface scratches extending in one direction, as a result of contact with the roller through neck stretching accompanied with relative movement with the roller.

Thus, the polymer piezoelectric film of the present invention is characterized by exhibiting a temperature-dispersion peak temperature of $d_{31}$ piezoelectricity coefficient at least 120° C., and surface scratches extending in one direction.

BEST MODE FOR PRACTICING THE INVENTION

Figure 1:
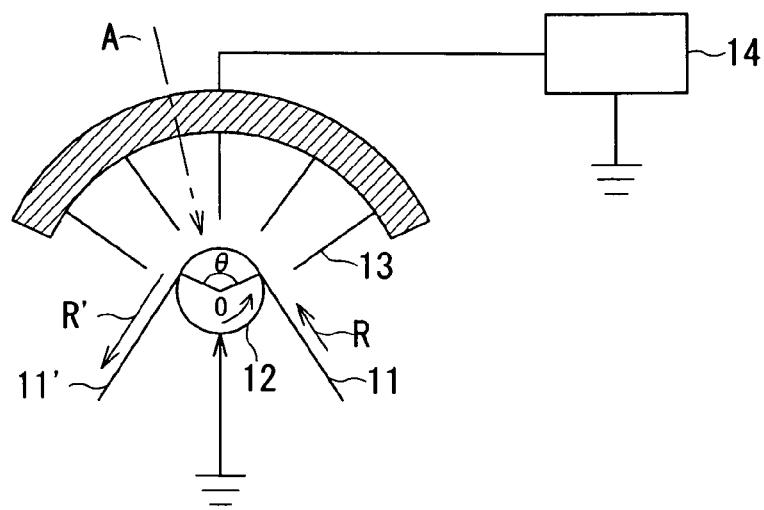
FIG. 1 is a schematic view showing an outline of neck stretching-polarization concurrent processing device including a small-diameter heating roller according to a conventional method.

Hereinbelow, the method for producing the polymer piezoelectric film of the present invention will be described in the order of steps involved therein with reference to a preferred embodiment thereof.

(Crystalline Polar Polymer Sheet)

A starting material used in the production method according to the present invention is a crystalline polar polymer sheet. It is known that if the polarization of a crystalline polar polymer is carried out under moderate conditions, piezoelectricity is developed (and also pyroelectricity in many cases). Examples of crystalline polar polymers used in the present invention may include: polyvinylidene fluoride resin and nylons having odd-numbered carbon chain, such as nylon 11, etc., but it is preferred to use a polyvinylidene fluoride resin in view of resultant high piezoelectricity, weatherability, heat resistance, etc.

Examples of the polyvinylidene fluoride resin may include: vinylidene fluoride homopolymer, and copolymers of vinylidene fluoride containing at least 50 mol %, preferably at least 70 mol %, of vinylidene fluoride units and units of other monomers copolymerizable with vinylidene fluoride, such as trifluoroethylene, tetrafluoroethylene, hexafluoro-propylene, trifluorochloroethylene, and vinyl fluoride.

The polyvinylidene fluoride resin may preferably be one having a high molecular weight so as to provide a high strength durable against neck stretching, more specifically one showing an inherent viscosity of at least 1.0 dl/g (when measured as a dimethylformamide solution at a concentration of 0.4 g/dl at a temperature of 30° C.). In order to provide a high strength and good stretchability in combination, it is particularly preferred to use a polyvinylidene fluoride resin having an inherent viscosity of 1.1-2.0 dl/g. A sheet of a polyvinylidene fluoride resin having an inherent viscosity below 1.0 dl/g is liable to cause breakage at a high probability due to an intense shearing force applied with a large-diameter roller (while it may be alleviated due to the use of a low-friction coefficient roller) during the neck stretching step on the large-diameter roller adopted in the present invention.

A sheet of the crystalline polar polymer represented by the above-mentioned polyvinylidene fluoride resin is treated by the method of the present invention. While the sheet formation may be performed by melt extrusion, solution casting, etc., it is preferred to use a sheet formed by melt extrusion or further subjected to an appropriate thickness adjustment as by stretching, etc. Especially, the thickness of the crystalline polar polymer sheet before the neck stretching-polarization concurrent processing by the method of present invention may preferably be in the range of 20-2500 μm, particularly 40-1500 μm. Less than 20 μm, the sheet is liable to have an insufficient strength. In excess of 2500 μm, the sheet becomes too rigid, and it becomes difficult to move the sheet in contact with a pre-heating roller before the stretching.

Figure 3:
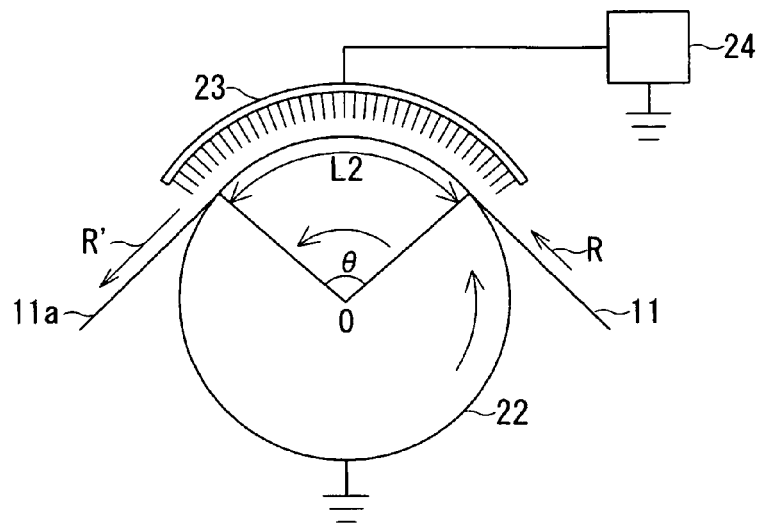
FIG. 3 is a schematic view showing an outline of an embodiment of neck stretching-polarization concurrent processing device including a large-diameter heating roller used in a method of the invention.

In accordance with the method of the present invention, a polymer piezoelectric film of the present invention may be obtained through processing by a neck stretching-polarization concurrent processing device, of which an outline is, for example, shown in FIG. 3.

Hereinbelow, the method of the present invention will be described more specifically with reference to the case where polyvinylidene fluoride resin, especially PVDF (vinylidene fluoride homopolymer), is used as a crystalline polar polymer. It will be easily understood to a person skilled in the art that a similar processing is possible for other crystalline polar polymers by some modification of conditions in consideration of difference in characteristics, such as the melting point and Curie point.

With reference to FIG. 3, a PVDF sheet 11 of which the thickness has been adjusted to 20-2500 μm, is fed at a speed R to a conductive heating roller 22 having a diameter of at least 30 mm, usually 30-500 mm, preferably 100-300 mm, and a reduced surface friction coefficient, to contact the roller for a length of L2, where the sheet 11 is subjected to neck stretching and is concurrently polarized (or poled) under the action of a high DC (direct current) electric field applied between a non-contact acute electrode 23 connected to a DC high-voltage power supply 24 and the grounded roller 22 (counter electrode). A film 11a after the neck stretching (which is already substantially equivalent to a polymer piezoelectric film of the present invention), leaves the roller 22 at a speed R' (>R) and receives post-processing, such as heat treatment for dimensional stabilization, as desired, to be wound about a take-up roller (not shown).

If the diameter of the roller 22 is less than 30 mm, the effect of increasing the contact length L2 with the sheet 11 is not sufficient, and the neck line can go out of the L2 range due to fluctuation (V, V') of the neck line in the sheet feeding direction, whereby the effect of stabilizing the piezoelectricity becomes insufficient. If the diameter exceeds 500 mm, the rotation torque becomes smaller and the stretching becomes difficult.

The surface friction coefficient of the roller 22 can be decreased in various ways. The easiest way may be to apply a lubricant, such as optionally-emulsified fine particles of polytetrafluoroethylene, higher fatty acid salts or esters, and fluorine-containing lubricants, to the peripheral face of the metallic roller 22. By this friction coefficient-reduction treatment, it has been confirmed that the breakage of sheet caused by a large-diameter mirror-finished metal roller can be prevented and the formation of a linear neck line NL becomes possible, so that it is possible to form a high-performance piezoelectric film of ca. 50 m in length. However, the lubricant is inevitably worn out as the continuation of the production, the formation of nonlinear neck line NL' gradually occurs until the sheet 22 is finally broken.

A more persistent reduction of the surface friction coefficient of the roller 22 can be accomplished by using a roller 22 having a roughened peripheral surface. A roughened surface may be provided by sandpaper processing of a mirror-finished metal roller surface or by use of a roller of a non-metallic conductive material formed originally with a rough surface. Generally, the large-diameter roller suited for the purpose of the present invention may have a ten-point average roughness Ra (JIS B0601-1994) of 0.1-30 μm, preferably 0.2-2 μm. Below 0.1 μm, the surface friction coefficient-reduction effect is not sufficient, and it is difficult to avoid the breakage of the sheet 11 or film 11a during the neck stretching of the crystalline polar polymer sheet accompanied with a relative displacement on the surface of the large-diameter roller. On the other hand, if the roughness is excessive, the sheet 11 is liable to be broken due to projections on the roller, and the scratches caused by contact with the rough surface roller are liable to occur to a level unacceptable for the product piezoelectric film.

The roller 22 has to be electroconductive so that it can operate as a counter electrode receiving a DC voltage of at least 5 kV, preferably 7-50 kV, applied to an acute or tip electrode 23 for polarization of the sheet 11. However, the required conductivity need not be so large and may be satisfied with an intrinsic electrical resistance on the order of $10^4$-$10^5$ ohm·cm or below that can be realized by titanium oxide-based or alumina-based ceramic.

The acute electrode 23 (that is a kind of a counter electrode with respect to the conductive roller electrode 22) is disposed to generate electric charges by corona discharge caused at its acute end and impart the charges to the surface of the film 11a for forming a DC electric field to polarize the PVDF sheet 11 (or film 11a) under neck stretching. In order to cause an effective corona discharge, it is preferred that the electrode 23 has an acute end. As the acute electrode, in addition to a needle electrode (which has a literally needle-like tip) explained with reference to the device of FIG. 1, a wire electrode (namely, a wire-form electrode having its portion closest to the roller 22 extending in parallel with and over an almost identical length as the roller-axis length of the roller 22) can also be used preferably. While it is possible to perform the polarization by using an electrode directly contacting the sheet 11 together with the roller electrode 22 instead of such a non-contact electrode, the sheet 11 to be processed is also subjected to neck stretching and is therefore liable to cause dielectric breakdown leading to a shutdown of the power supply in that case, so that the use of a non-contact electrode is preferred.

The spacing between the acute electrode 23 and the roller 22 surface, may generally be preferably on the order of 5-30 mm. At too small a spacing, dielectric breakdown of the film 11a is liable to occur, whereas if excessive, corona discharge is suppressed to reduce the polarization effect. The acute electrode 23 has to be provided in a number large enough to cover the polarized area of the sheet 11, i.e., the full width×the contact length $_{L2}$ with the roller 22, and more specifically, it is desirable to dispose ca. 0.5-2 electrodes/cm when the acute electrode 23 is a wire electrode, and at a density of ca. 0.5-3 electrodes/cm$^2$ in the case of needle electrodes The length $_{L2}$ where the sheet 11 contacts the roller 22 (therefore, almost the same length as the length of the sheet 11 covered with the acute electrodes 23 and receiving a polarization process) on the roller 22, may preferably be at least 30 degrees in terms of a corresponding central angle θ of the roller 22, and at most 210 degrees. At too small θ, the piezoelectricity-stabilizing effect due to an increased $_{L2}$ becomes scarce even if a large-diameter roller is used, and at too large θ, the force of pressing the sheet 11 against the roller 22 becomes large so that the sheet 11 (or film 11') is liable to be broken.

In order to cause the neck stretching effectively, the surface temperature of the roller 22 (regarded as almost the same as the sheet 11 temperature) may suitably be from room temperature to below the melting point, especially ca. 70-130° C. In order to obviate intense heating on the roller 22, it is possible to dispose a preheating means, such as a preheating roller having a surface temperature lower than that of the roller 22 or an infrared heater, at a position upstream from the roller 22.

The entire stretching ratio around the roller 22 (i.e., a region between a send roller on the upstream side and a receiver roller on the downstream side) including the neck stretching ratio on the roller 22 (occupying most of the entire stretching ratio), may preferably be in the range of 2.5 to 6 times. Below 2.5 times, the necking is not stabilized but above 6 times, the sheet or film is liable to be broken.

Figure 4:
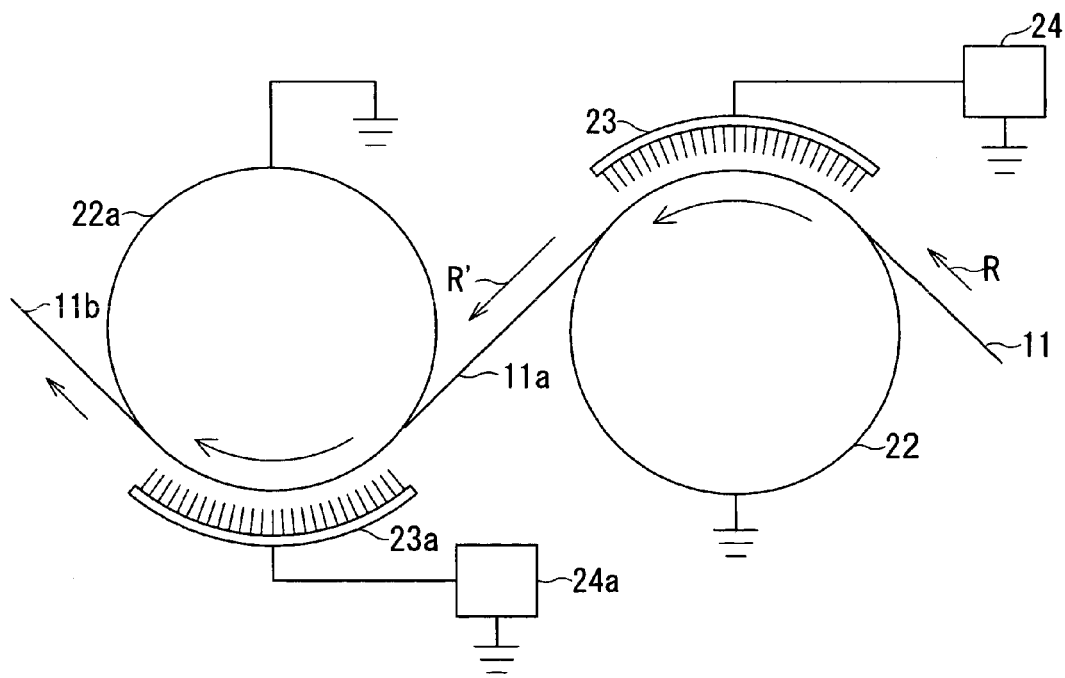
FIG. 4 is a schematic view showing an outline of another embodiment of neck stretching-polarization concurrent processing device including a large-diameter heating roller used in a method of the invention.

FIG. 4 illustrates an outline of the stretching-polarization concurrent processing device for practicing another preferred embodiment of the polymer piezoelectric film production method of the present invention. Referring to FIG. 4, a right half of the device for providing a piezoelectric film 11a (including a heating and counter electrode roller 22, an acute electrode 23, and a DC high-voltage power supply 24) is almost identical to what has been described with reference to FIG. 3.

In the device of FIG. 4, the piezoelectric film 11a formed through the above-described neck stretching-polarization concurrent processing as in the device of FIG. 3, is further subjected to a polarization processing with a reverse polarity of voltage applied to the surface thereof under heating by means of a second heating roller 22a, a second acute electrode 23a, and a second high-voltage power supply 24a which supplies a voltage of reverse polarity with respect to the voltage supplied from the power supply 24. As a result of such an additional polarization process, even for a thick piezoelectric film, stable polarization becomes possible and the piezoelectricity is stabilized.

The piezoelectric film 11a (or 11b) produced in the above-described manner may be subjected to an optional post-treatment, such as heat treatment for dimensional stabilization, and wound about a take-up roller as a product piezoelectric film for storage or circulation in the market, or provided with an electrode on one or both surfaces thereof by vapor deposition or via an adhesive to provide a film-form piezoelectric (or pyroelectric) element product.

Figure 5:
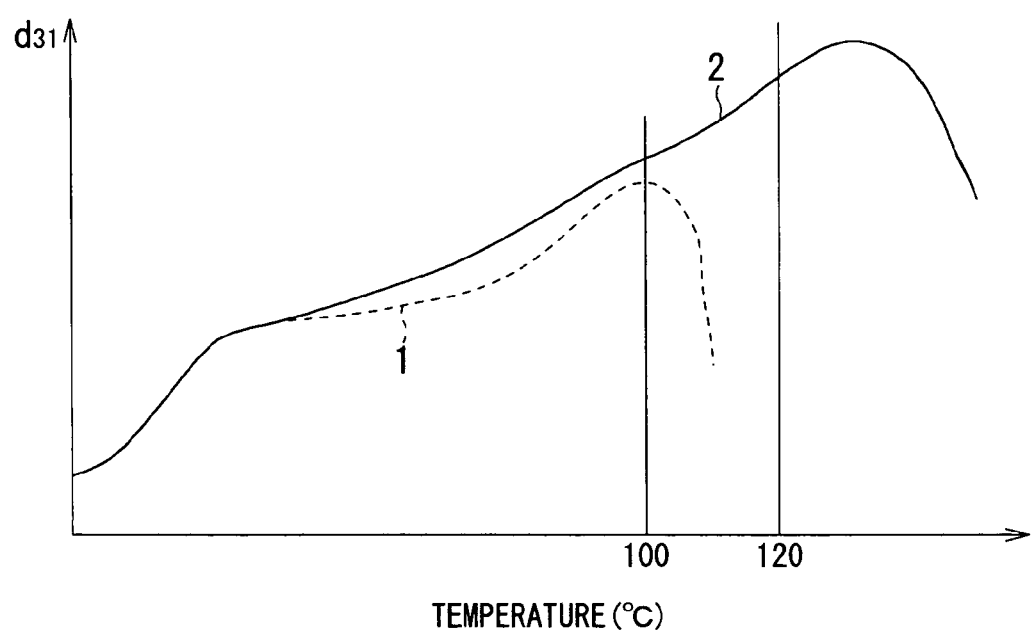
FIG. 5 is a graph showing a temperature-dispersion curve of $d_{31}$ piezoelectric coefficient.

The thus-produced polymer piezoelectric film of the present invention may exhibit, as representative properties, a thickness: 10-500 μm, and a $d_{31}$ piezoelectricity coefficient in the stretched direction (average): 15-35 pC/N, including only a local deviation thereof within ±20% or less from the average over almost the entire region, as a characteristic. Further, as an important feature of the piezoelectric film of the present invention obtained through the stable neck stretching-polarization concurrent processing method, the piezoelectric film exhibits an excellent heat resistance of piezoelectricity stably over a large area. This point is explained with reference to FIG. 5 showing a temperature-dispersion (temperature dependence) curve of $d_{31}$ piezo-electricity coefficient. Thus, an example of $d_{31}$ temperature-dispersion curve of the piezoelectric film obtained through the conventional stretching→polarization sequential processing is shown in FIG. 5 as dotted line 1 showing a peak temperature up to nearly 100° C. at the maximum. This means that as the measurement temperature rises, the $d_{31}$ piezoelectric coefficient of the film gradually increases up to 100° C. as the peak temperature but rapidly decreases above 100° C., and the once-decreased piezoelectric coefficient does not recover even if the temperature is restored to below 100° C. or less. Therefore, it is difficult or impossible to use such a piezoelectric film at a temperature above 100° C. On the other hand, the piezoelectric film of the present invention obtained through the neck stretching-polarization concurrent processing shows a temperature dispersion curve 2 as shown in FIG. 5 including a peak temperature of at least 120° C. Accordingly, the piezoelectric film can be used in a temperature region exceeding 100° C., and it is permanently usable in a temperature region up to 120° C. A further important feature of the piezoelectric film of the present invention is that such a good heat resistance of piezoelectricity is secured uniformly over an extremely large area, as a result of stabilization of the neck stretching-polarization process according to the production method of the present invention. More specifically, a characteristic feature of the piezoelectric film of the present invention is that it exhibits a temperature-dispersion peak temperature of $d_{31}$ piezoelectricity coefficient at least 120° C. over an area thereof covering a full width in a direction perpendicular to a direction of developing the $d_{31}$ piezoelectricity coefficient (i.e., the stretching direction) and a length of at least 1 m in the direction of developing the $d_{31}$ piezoelectricity coefficient.

Figure 2:
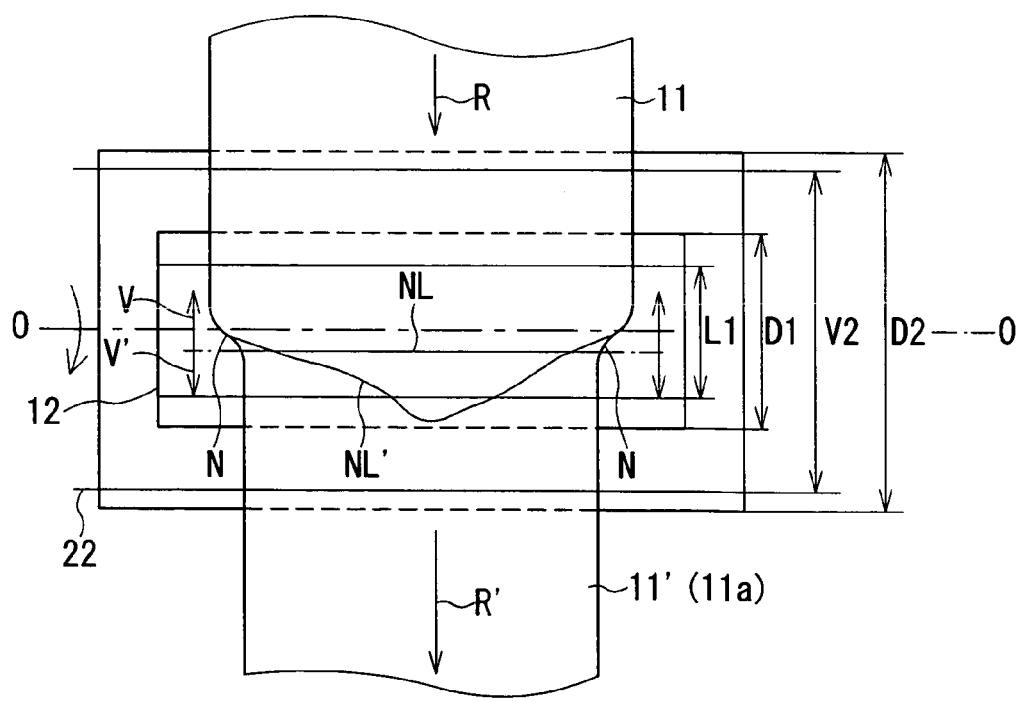
FIG. 2 is a schematic top view for illustrating a neck stretching state on a heating roller under application of a polarization electric field.

Further, according to a preferred embodiment, the piezoelectric film of the present invention has an additional feature of having surface scratches extending in one direction in agreement with the direction of developing $d_{31}$ piezoelectricity coefficient. Such surface scratches are obtained in the production method of the present invention as a result of using a surface-roughened roller as the heating and counter electrode roller 22. More specifically, as explained with reference to FIG. 2, when a sheet 11 is subjected to a stable neck stretching over contact length L2 on a large-diameter roller 22, the sheet 11 moves at a speed R before the neck line NL and at R' after the NL giving a ratio R'/R as large as 2 or more. While the sheet 11 moves at speeds ranging R to R', the roller 22 can only rotate at a fixed peripheral speed within the range of R to R'. Therefore, the sheet 11 and the roller 22 move over the contact length L2 with a certain speed difference along a substantial portion of L2 (usually a portion contacting the film 11a after NL). This is the reason why the piezoelectric film of the present invention obtained by using a surface-roughed roller is provided with surface scratches consistent with the direction of developing the $d_{31}$ piezoelectric coefficient Such surface scratches cause some rise of haze value of the piezoelectric film and can be disadvantageous in a use requiring a transparent piezoelectric film. However, a principal use of the piezoelectric film of the present invention is a piezoelectric (or pyroelectric) element obtained by attaching an electrode on at least one surface thereof by vapor deposition or an adhesive. In this use, the surface roughening by formation of surface scratches is preferable since it contributes to a remarkable increase in attached strength of the surface electrode.

EXAMPLES

Hereinbelow, the present invention will be described more specifically based on Examples and Comparative Examples. The physical properties described in the present specification including the following examples are based on values measured according to the following methods.

(1) Piezoelectricity Coefficient $d_{31}$ (and the Temperature Dispersion Thereof)

A polymer piezoelectric film was provided with a 100-800 nm-thick Al vapor deposition electrode on both surfaces thereof, and a sample measuring 7 mm×30 mm was cut out at a prescribed spot from the piezoelectric film. The sample was set by clamping in a sample chamber of a piezoelectric coefficient measuring device ("RHEOLOGRAPH SOLID", made by K. K. Toyo Seiki Seisakusho), and the $d_{31}$ piezoelectricity coefficient was measured under the conditions of a tension: 1 N (Newton), and a frequency: 10 Hz. The measurement was repeated at an increment of 1° C. while raising a temperature at a rate of 2° C./min. from room temperature to 150° C. to obtain a temperature dispersion curve of $d_{31}$ piezoelectricity coefficient (2) Surface Roughness Coefficient Ra A roller surface roughness Ra was measured by means of a surface roughness meter ("SURFCORDER SE1700", made by K. K. Kosaka Kenkyusho) according to JIS B0601-1994.

(3) Electrical Resistance of a Roller

An ordinary tester was used to measure an electrical resistance between the roller axis and the surface.

Comparative Example 1

A 160 μm-thick sheet of PVDF having an inherent viscosity (η i) of 1.2 dl/g (polyvinylidene fluoride: made by Kureha Kagaku Kogyo K. K.) was supplied to a device having an organization substantially as shown in FIG. 1 and subjected to a neck stretching-polarization concurrent processing. More specifically, the above PVDF sheet was moved over a hard chrome mirror-finished heating roller 12 (with a surface roughness Ra<0.03 μm) so as to provide a contact center angle θ=ca. 40 deg. and stretched under the conditions of a sheet supply speed of 10 cm/min. and a take-up speed of 40 cm/min. In this state, a DC voltage applied to needle electrodes 13 spaced apart from the roller 12 by ca. 10 mm and disposed at a density of 2 electrodes/cm² was increase form 0 kV to 9 kV to effect a neck stretching-polarization concurrent processing.

At the initial period when the applied voltage was 0 kV, neck stretching was stably performed on the roller 12 surface, and a stretched film of ca. 40 μm in thickness and ca. 300 mm in width was obtained. However, when 9 kV was applied, it changed into a state where a non-linear neck line NL' was formed by gradual bellow-like elongation of the central portion and the whole neck line moved toward the downstream on the roller surface until the neck line went out of the roller surface.

As a result of the measurement of $d_{31}$ piezoelectric coefficient, the thus-formed piezoelectric film exhibited $d_{31}$=25 pC/N (and a dispersion peak temperature≧120° C.) with respect to a portion (of ca. 0.5 m in length) which was supposed to be formed in a relatively early stage when the neck line occurred on the roller surface but exhibited only $d_{31} \leq 1$ pC/N with respect to the portions which were supposed to be formed where the neck line went out of the roller surface including a side marginal portion outside the ca. 0.5 m-length portion formed in the relatively early stage.

Comparative Example 2

A neck stretching-polarization concurrent processing of a 160 μm-thick PVDF sheet was performed in the same manner as in Comparative Example 1 except for using a hard chrome mirror-finished roller (Ra<0.03 μm) of 200 mm in diameter as the heating roller.

In the course of gradually increasing the voltage applied between the roller and the needle electrodes up to 10 kV, the neck line moved downwards and became non-linear until the breakage of the stretched film at the time of application of 10 kV, so that a long period of production was impossible.

With respect to the portion supplied with 10 kV before the breakage, thickness irregularities were noticeable with eyes, and a relatively good portion (of ca. 1 m in length) exhibited $d_{31}$=27 pC/N (and a dispersion peak temperature≧120° C.) but side portions outside the relatively good portion included a portion exhibiting only $d_{31} \leq 1$ pC/N.

Example 1

A neck stretching-polarization concurrent processing of a 160 μm-thick PVDF sheet was performed in the same manner as in Comparative Example 2 except for using a heating roller (corresponding to one denoted by 22 in FIG. 3) formed by uniformly applying a lubricant comprising polytetrafluoroethylene fine particles in the form of an aerosol for spraying ("DAIFRE GA6010", made by Daikin Kogyo K. K.) onto the surface of a hard chrome mirror-finished roller used in Comparative Example 2.

The processing could be continued until the voltage applied between the roller(22) and the needle electrodes (23) was increased up to 12 kV. Under this condition, a linear neck line NL was formed sufficiently within the roller-sheet contact length L2 (=ca. 70 mm) while some up-and-down fluctuation of the neck line was observed The processing was continued until ca. 20 m of a piezoelectric film was produced, when the instability of neck line (i.e., non-linear formation and deviation out of the contact length L2 region of the neck line) started to be recognized, so that the processing was terminated thereafter.

The film obtained under the stable processing conditions exhibited a piezoelectricity coefficient $d_{31}$=25 pC/N (and a dispersion peak temperature≧120° C.) over the full width and no irregularity in piezoelectricity coefficient or thickness.

Example 2

A neck stretching-polarization concurrent processing of a 160 μm-thick PVDF sheet was performed in the same manner as in Example 1 except for using a heating roller (of surface roughness Ra=1 μm; corresponding to one denoted by 22 in FIG. 3) formed by abrading the surface of a hard chrome mirror-finished roller used in Comparative Example 2, successively with sandpaper (of #40) and sandpaper (of #240).

Under the voltage application condition of 12 kV between the roller(22) and the needle electrodes (23), a stable production of a piezoelectric film under a stable neck stretching state was possible while some fluctuation of a linear neck line within the contact length $_{L2}$ region was observed, and the stable production state was maintained even after production of 100 m of piezoelectric film.

The thus-obtained piezoelectric film exhibited a piezoelectricity coefficient $d_{31}$=30 pC/N (and a dispersion peak temperature≧120° C.) over the full width, and no irregularity in piezoelectricity coefficient or thickness was observed.

Example 3

A neck stretching-polarization concurrent processing of a 160 μm-thick PVDF sheet was performed in the same manner as in Example 2 except for using a heating roller (22) of 200 mm in outer diameter surfaced with a titanium oxide-based ceramic layer (of surface roughness Ra=1 μm and a resistance between the roller axis and the surface=77 ohm).

Under the voltage application condition of 12 kV between the roller(22) and the needle electrodes (23), a stable production of a piezoelectric film under a stable neck stretching state was possible while some fluctuation of a linear neck line within the contact length L2 region was observed, and the stable production state was maintained even after production of 200 m of piezoelectric film.

The thus-obtained film exhibited a piezoelectricity coefficient $d_{31}$=30 pC/N (and a dispersion peak temperature≧120° C.) over the full width, and no irregularity in piezoelectricity coefficient or thickness was observed.

Example 4

A neck stretching-polarization concurrent processing of a 1000 μm-thick PVDF sheet was performed by using a device having an organization as roughly shown in FIG. 4. Referring to FIG. 4, rollers 22 and 22a were each identical to the 200 μm-dia. ceramic-coated roller used in Example 3. Needle electrodes 23 and 23a were respectively disposed at a density of 2 electrodes/cm2., and the spacings between the needle electrodes (23,23a) and the rollers (22,22a) were respectively set at 10 mm.

For the processing, 1000 μm-thick PVDF sheet was fed to the heating roller 22 with surface temperature of 120° C. at a speed of 50 cm/min., and a DC voltage of +25 kV was applied from a power supply 24 via needle electrodes 23 to perform stretching-polarization concurrent processing on the roller 22.

The film 11a having left the roller 22 was fed to a roller 22a with a surface temperature of 120° C., and a DC voltage of −25 kV was applied from a power supply 24a to the film 11a on the roller 22a while the film 11a was taken up at a take-up speed of 210 cm/min.

On the roller 22, a stable neck stretching state was formed while some fluctuation of a linear neck line within the contact length L2 region was observed, and including the additional polarization processing on the roller 22a, stable formation of a piezoelectric film was possible as a whole. The stable production state was maintained even after production of 200 m of piezoelectric film The thus-obtained film exhibited a piezoelectricity coefficient $d_{31}$=30 pC/N (and a dispersion peak temperature≧120° C.) over the full width, and no irregularity in piezoelectricity coefficient or thickness was observed.

The production conditions of the above Examples and a Comparative Examples, and the properties of the resultant piezoelectric films are inclusively summarized in the following Table 1.

TABLE 1

| | Stretch roller (12 or 22) | | | Piezoelectric film | | | | | |
|---|---|---|---|---|---|---|---|---|---|
| | | | Surface | Sheet 11 | Applied | Stable | (stably produced portion) | | |
| Example | Diameter (mm) | Material | treatment (state) | thickness (μm) | voltage (kV) | production length(m) | Thickness (μm) | $d_{31}$ (pC/N) | Surface scratches |
| Comp. 1 | 20 | Mirror-finished metal | None (Ra < 0.03 μm) | 160 | 9 | 0.3 | 40 | (25) | No |
| Comp. 2 | 200 | Mirror-finished metal | None (Ra < 0.03 μm) | 160 | 10 | 1 | 40 | (27) | No |
| 1 | 200 | Mirror-finished metal | lubricant | 160 | 12 | 20 | 40 | 30 | No |

TABLE 1-continued

| | Stretch roller (12 or 22) | | | Sheet 11 thickness (μm) | Applied voltage (kV) | Stable production length(m) | Piezoelectric film (stably produced portion) | | |
|---|---|---|---|---|---|---|---|---|---|
| Example | Diameter (mm) | Material | Surface treatment (state) | | | | Thickness (μm) | $d_{31}$ (pC/N) | Surface scratches |
| 2 | 200 | Mirror-finished metal | sandpaper (Ra = 1 μm) | 160 | 12 | ≧200 | 40 | 30 | Yes |
| 3 | 200 | Ceramic | (Ra = 0.4 μm) | 160 | 15 | ≧200 | 40 | 30 | Yes |
| 4 | 20 | Ceramic | (Ra = 0.4 μm) | 1000 | 25*1 | ≧200 | 250 | 30 | Yes |

*1 A reverse-polarity voltage was additionally applied from the back on the roller 22a (FIG. 4).

Incidentally, in all the Examples described above, large-diameter rollers of 200 mm in diameter were used, but it was confirmed in preliminary tests, a substantial improvement over Comparative Example 1 could be obtained even by using a 30 mm-dia. roller coated with the lubricant or surface-roughened by sandpaper treatment, and a remarkable improvement could be obtained if a roller of 50 mm or larger in diameter was used.

INDUSTRIAL APPLICABILITY

As is understood from the above-described results of Examples and Comparative Examples including those shown in Table 1, according to the present invention, there is provided a stable method for producing a polymer piezoelectric film showing stable piezo-electricity over a large area, wherein a neck stretching-polarization concurrent processing is realized by using a large-diameter roller with a reduced surface friction coefficient as a heating roller for performing the neck stretching-polarization concurrent processing. Also, a polymer piezoelectric film thus produced and particularly improved in stable heat resistance of piezoelectricity over a large area, is provided.

The invention claimed is:

1. A method for producing a polymer piezoelectric film, comprising:
   moving and stretching a crystalline polar polymer sheet in contact with a conductive stretching roller having a diameter of at least 30 mm and a surface friction coefficient which has been reduced to a level that allows a relative displacement of the crystalline polar polymer sheet in contact with the conductive stretching roller, wherein the stretching is neck stretching, and
   a polarization voltage is applied between an acute electrode disposed opposite to and in non-contact with the crystalline polar polymer sheet and the conductive stretching roller to polarize the crystalline polar polymer sheet simultaneously with the neck stretching.

2. The production method according to claim 1, wherein the conductive stretching roller provides an arc contacting the crystalline polar polymer sheet and forming a central angle of at least 30 degrees.

3. The production method according to claim 1, wherein the conductive stretching roller has been provided with the reduced surface friction coefficient by application of a lubricant thereon.

4. The production method according to claim 1, wherein the conductive stretching roller has been provided with the reduced surface friction coefficient owing to a rough surface thereof.

5. The production method according to claim 4, wherein the conductive stretching roller comprises a surface-roughened metal roller.

6. The production method according to claim 4, wherein the conductive stretching roller comprises a ceramic roller having a rough surface.

7. The production method according to claim 4, wherein the conductive stretching roller exhibits a surface roughness coefficient Ra of 0.1-30 μm.

8. The production method according to claim 1, comprising an additional polarization step wherein an electric field is applied to the crystalline polar polymer sheet, after the polarization on the conductive stretching roller, in a direction identical to the polarization voltage applied when the crystalline polar polymer sheet is on the conductive stretching roller.

9. The production method according to claim 1, wherein the crystalline polar polymer comprises a polyvinylidene fluoride resin.

* * * * *